United States Patent
Sun

(10) Patent No.: US 8,892,618 B2
(45) Date of Patent: Nov. 18, 2014

(54) METHODS AND APPARATUSES FOR CONVOLUTIVE BLIND SOURCE SEPARATION

(75) Inventor: Xuejing Sun, Beijing (CN)

(73) Assignee: Dolby Laboratories Licensing Corporation, San Francisco, CA (US)

(*) Notice: Subject to any disclaimer, the term of this patent is extended or adjusted under 35 U.S.C. 154(b) by 277 days.

(21) Appl. No.: 13/531,118

(22) Filed: Jun. 22, 2012

(65) Prior Publication Data

US 2013/0031152 A1 Jan. 31, 2013

Related U.S. Application Data

(60) Provisional application No. 61/540,344, filed on Sep. 28, 2011.

(30) Foreign Application Priority Data

Jul. 29, 2011 (CN) .......................... 2011 1 0226040

(51) Int. Cl.
G06F 17/10 (2006.01)
G10L 21/0272 (2013.01)
G06K 9/62 (2006.01)
H03H 21/00 (2006.01)

(52) U.S. Cl.
CPC .......... *G10L 21/0272* (2013.01); *G06K 9/6243* (2013.01); *G06K 9/6244* (2013.01); *G06K 9/6246* (2013.01); *H03H 21/0027* (2013.01); *H03H 2021/0036* (2013.01)
USPC .......................................... 708/315; 708/300

(58) Field of Classification Search
None
See application file for complete search history.

(56) References Cited

U.S. PATENT DOCUMENTS

| | | | |
|---|---|---|---|
| 6,167,417 | A | 12/2000 | Parra |
| 6,185,309 | B1 | 2/2001 | Attias |
| 6,343,268 | B1 | 1/2002 | Balan |
| 6,898,612 | B1 | 5/2005 | Parra |
| 7,047,189 | B2 | 5/2006 | Acero |
| 7,474,756 | B2 | 1/2009 | Rickard |
| 7,603,401 | B2 | 10/2009 | Parra |
| 7,738,574 | B2 | 6/2010 | Jang |

(Continued)

FOREIGN PATENT DOCUMENTS

| | | |
|---|---|---|
| WO | 01/17109 | 3/2001 |
| WO | 2009130513 | 10/2009 |

OTHER PUBLICATIONS

Pedersen, M.S., et al., "A Survey of Convolutive Blind Source Separation Methods" in Springer Handbook of Speech Processing, Berlin, 2007.

(Continued)

*Primary Examiner* — Michael D Yaary

(57) ABSTRACT

Methods and apparatuses for convolutive blind source separation are described. Each of a plurality of input signals is transformed into frequency domain. Values of coefficients of unmixing filter corresponding to frequency bins are calculated by performing a gradient descent process on a cost function at least dependent on the coefficients of the unmixing filters. In each iteration of the gradient descent process, gradient terms for calculating the values of the same coefficient of the unmixing filters are adjusted to improve smoothness of gradient terms across the frequency bins. With respect to each of the frequency bins, source signals are estimated by filtering the transformed input signals through the respective unmixing filter configured with the calculated values of the coefficients. The estimated source signals on the respective frequency bins are transformed into time domain. The cost function is adapted to evaluate decorrelation between the estimated source signals.

19 Claims, 4 Drawing Sheets

(56) References Cited

U.S. PATENT DOCUMENTS

| | | |
|---|---|---|
| 7,765,089 B2 | 7/2010 | Baxter |
| 7,797,153 B2 | 9/2010 | Hiroe |
| 7,917,336 B2 | 3/2011 | Parra |
| 2009/0222262 A1 | 9/2009 | Kim |
| 2009/0316928 A1 | 12/2009 | Seltzer |
| 2010/0183178 A1 | 7/2010 | Kellermann |

OTHER PUBLICATIONS

Weinstein, E., et al., "Multi-Channel Signal Separation by Decorrelation" IEEE Trans. Speech Audio Processing, vol. 1, pp. 405-413, Apr. 1993.

Gerven, S.V., et al., "Signal Separation by Symmetric Adaptive Decorrelation: Stability, Convergence, and Uniqueness", IEEE Trans. Sig. Proc., vol. 43, No. 7, pp. 1602-1612, Jul. 1995.

Huang, J., et al., "Subband-Based Adaptive Decorrelation Filtering for Co-Channel Speech Separation", IEEE Trans. Speech and Audio Process, vol. 8, No. 4, pp. 402-406, Jul. 2000.

Parra, L., et al., "Convolutive Blind Source Separation of Non-Stationary Source", IEEE Trans. on Speech and Audio Processing, pp. 320-327, May 2000.

Fancourt, C., et al., "The Coherence Function in Blind Source Separation of Convolutive Mixtures of Non-Stationary Signals", IEEE International Workshop on Neural Networks and Signal Processing 2001.

Ikram, M.Z., et al., "Permutation Inconsistency in Blind Speech Separation: Investigation and Solutions", Speech and Audio Processing, IEEE Transactions on vol. 13, No. 1, pp. 1-13, Jan. 2005.

Dam, H. H., et al., "Blind Signal Separation Using Steepest Descent Method" IEEE Transactions on Signal Processing, vol. 55, No. 8, Aug. 2007.

Dam, H.H., et al., "Second-Order Blind Signal Separation for Convolutive Mixtures Using Conjugate Gradient" IEEE Signal Processing Letters, vol. 15, 2008.

Douglas, Scott C., "Self-Stabilized Gradient Algorithms for Blind Source Separation With Orthogonality Constraints" IEEE Transactions on Neural Networks, vol. 11, No. 6, Nov. 2000.

Hu, R., et al., "Adaptive Decorrelation Filtering Algorithm for Speech Source Separation in Uncorrelated Noises" ICASSP 2005.

Jafari, M.G., et al. "A Novel Adaptive Learning Rate Sequential Blind Source Separation Algorithm" Signal Processing 2003.

Jia, Z., et al., "An Improved Natural Gradient Algorithm for Blind Source Separation" 2010 2nd International Asia Conference on Informatics in Control, Automation and Robotics.

Mei, T., et al., "Convolutive Blind Source Separation Based on Disjointness Maximization of Subband Signals" IEEE Signal Processing Letters, vol. 15, 2008.

Parra, L., et al., "On-Line Convolutive Blind Source Separation of Non-Stationary Signals" Journal of VLSI Signal Processing, 39-46, 2000.

Rahbar, K., et al., "Blind Source Separation of Convolved Sources by Joint Approximate Diagonalization of Cross-Spectral Density Matrices" ICASSP 2001, vol. 5, pp. 2745-2748.

Russell, I., et al., "Time Domain Optimization Techniques for Blind Separation of Non-Stationary Convolutive Mixed Signals" Signal and Image Processing, 2003.

Wang, W., et al., "Penalty Function-Based Joint Diagonalization Approach for Convolutive Blind Separation of Nonstationary Sources" IEEE Transactions on Signal Processing, vol. 53, No. 5, May 2005, pp. 1654-1669.

Ye, J., et al., "An Improved Cross-Correlation Based Method of Blind Source Separation in Frequency Domain" IEEE Int. Conf. Neural Networks & Signal Processing, Nanjing, China Dec. 14-17, 2003.

Ye, Z. et al., "Blind Separation of Convolutive Mixed Source Signals by Using Robust Nonnegative Matrix Factorization", 2009 Fifth International Conference on Natural Computation, pp. 343-346.

METHODS AND APPARATUSES FOR CONVOLUTIVE BLIND SOURCE SEPARATION

CROSS REFERENCE TO RELATED APPLICATIONS

This Application claims the benefit of priority to related, co-pending Chinese Patent Application number 201110226040.4 filed on 29 Jul. 2011 and U.S. Patent Application No. 61/540,344 filed on 28 Sep. 2011 entitled "Methods and Apparatuses for Convolutive Blind Source Separation" by Sun, Xuejing hereby incorporated by reference in its entirety.

TECHNICAL FIELD

The present invention relates generally to audio signal processing. More specifically, embodiments of the present invention relate to methods and apparatuses for convolutive blind source separation.

BACKGROUND

In various real-world applications, a convolutive mixing model is usually used to approximate the relationships between the original source signals and the mixed signals captured by the sensors such as microphones. A linear convolution can be approximated by a circular convolution if the frame size of the discrete Fourier transform (DFT) is much larger than the channel length. Then a convolutive mixing process can be represented as multiplication in the frequency domain $$Y(\omega,t) = W(\omega,t) X(\omega,t) \quad (1)$$

where $Y(\omega,t)$ represents the estimated sources $[Y_1(\omega,t), \ldots, Y_N(\omega,t)]^T$, $X(\omega, t)$ is the microphone signals $[X_1(\omega,t), \ldots, X_N(\omega,t)]^T$, and $W(\omega,t)$ (also called as unmixing filter for frequency bin $\omega$) denotes the unmixing matrix including unmixing filter coefficients.

For example, in a two-input-two-output (TITO) case, by assuming a unit gain for direct channels, the unmixing matrix can be represented as $$W(\omega, t) = \begin{bmatrix} 1 & W_{12}(\omega, t) \\ W_{21}(\omega, t) & 1 \end{bmatrix} \quad (2)$$

Then the separated signals can be represented as $$Y_1(\omega,t) = X_1(\omega,t) + W_{12}(\omega,t) X_2(\omega,t) \quad (3)$$

$$Y_2(\omega,t) = X_2(\omega,t) + W_{21}(\omega,t) X_1(\omega,t) \quad (4)$$

Various approaches have been proposed to estimate the unmixing filters. One class of algorithms obtain separation based on second order statistics (SOS) by requiring only non-correlated sources rather than the stronger condition of independence. By exploring additional constraints such as non-stationarity, sufficient conditions for separation can be achieved for SOS systems. One SOS-based approach is the so-called adaptive decorrelation filter (ADF) formulation, which is based on the classical adaptive noise cancellation (ANC) scheme. (See E. Weinstein, M. Feder, and A. V. Oppenheim, "Multi-channel signal separation by decorrelation," IEEE Trans. Speech Audio Processing, vol. 1, pp. 405-413, April 1993) Other SOS-based approaches have also been proposed, where a cost function for evaluating the decorrelation between separated signals is defined, and values of coefficients of unmixing filters are calculated adaptively by performing a gradient descent process on the cost function. (See Parra L., Spence C., "Convolutive blind source separation of non-stationary sources", IEEE Trans. on Speech and Audio Processing pp. 320-327, May 2000.)

SUMMARY

According to an embodiment of the present invention, a method of performing convolutive blind source separation is provided. Each of a plurality of input signals is transformed into frequency domain. Values of coefficients of unmixing filters corresponding to frequency bins are calculated by performing a gradient descent process on a cost function at least dependent on the coefficients of the unmixing filters. In each iteration of the gradient descent process, gradient terms for calculating the values of the same coefficient of the unmixing filters are adjusted to improve smoothness of the gradient terms across the frequency bins. With respect to each of the frequency bins, source signals are estimated by filtering the transformed input signals through the respective unmixing filter configured with the calculated values of the coefficients. The estimated source signals on the respective frequency bins are transformed into time domain. The cost function is adapted to evaluate decorrelation between the estimated source signals.

According to an embodiment of the present invention, an apparatus for performing convolutive blind source separation is provided. The apparatus includes a first transformer, a calculator, an estimator and a second transformer. The first transformer transforms each of a plurality of input signals into frequency domain. The calculator calculates values of coefficients of unmixing filters corresponding to frequency bins by performing a gradient descent process on a cost function at least dependent on the coefficients of the unmixing filters. In each iteration of the gradient descent process, gradient terms for calculating the values of the same coefficient of the unmixing filter are adjusted to improve smoothness of the gradient terms across the frequency bins. With respect to each of the frequency bins, the estimator estimates source signals by filtering the transformed input signals through the respective unmixing filter configured with the calculated values of the coefficients. The second transformer transforms the estimated source signals on the respective frequency bins into time domain. The cost function is adapted to evaluate decorrelation between the estimated source signals.

According to an embodiment of the present invention, a computer-readable medium having computer program instructions recorded thereon is provided. When being executed by a processor, the instructions enable the processor to perform a method of performing convolutive blind source separation. According to the method, each of a plurality of input signals is transformed into frequency domain. Values of coefficients of unmixing filters corresponding to frequency bins are calculated by performing a gradient descent process on a cost function at least dependent on the coefficients of the unmixing filters. In each iteration of the gradient descent process, gradient terms for calculating the values of the same coefficient of the unmixing filters are adjusted to improve smoothness of the gradient terms across the frequency bins. With respect to each of the frequency bins, source signals are estimated by filtering the transformed input signals through the respective unmixing filter configured with the calculated values of the coefficients. The estimated source signals on the respective frequency bins are transformed into time domain.

The cost function is adapted to evaluate decorrelation between the estimated source signals.

BRIEF DESCRIPTION OF DRAWINGS

The present invention is illustrated by way of examples, and not by way of limitation, in the figures of the accompanying drawings and in which like reference numerals refer to similar elements and in which.

DETAILED DESCRIPTION

Figure 1:
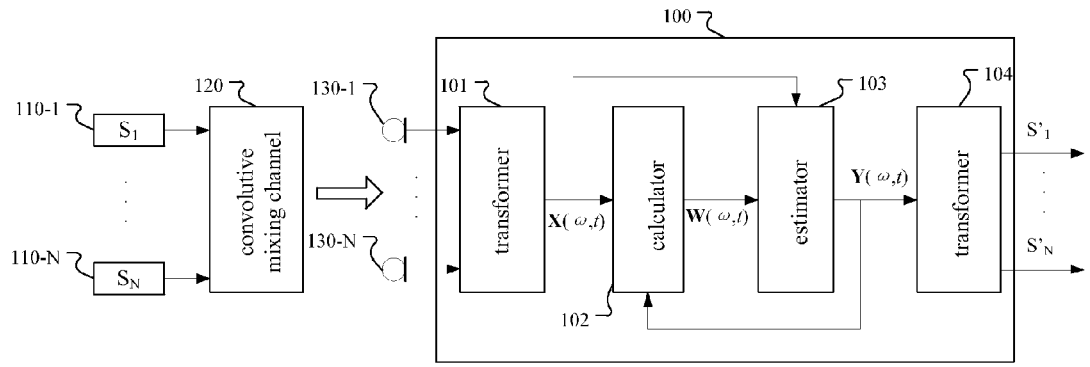
FIG. 1 is a block diagram illustrating an example apparatus for performing convolutive blind source separation according to an embodiment of the present invention.

The embodiments of the present invention are below described by referring to the drawings. It is to be noted that, for purpose of clarity, representations and descriptions about those components and processes known by those skilled in the art but unrelated to the present invention are omitted in the drawings and the description.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof.

A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wired line, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1 is a block diagram illustrating an example apparatus 100 for performing convolutive blind source separation according to an embodiment of the present invention.

As illustrated in FIG. 1, apparatus 100 includes a transformer 101, a calculator 102, an estimator 103 and a transformer 104.

Sound sources 110-1 to 110-N emit sound signals $S_1$ to $S_N$ respectively. Through respective convolutive channels 120, mixed signals of sound signals $S_1$ to $S_N$ are captured by microphones 130-1 to 130-N respectively. The captured signals are converted into digital signals $s_1$ to $s_N$ respectively.

Transformer 101 transforms digital signals $s_1$ to $s_N$ into frequency domain respectively. For example, from each digital signal $s_i$, transformer 101 may obtain a frame corresponding to time period from t to t+T, and convert the frame into frequency domain. Therefore, signals $X(\omega,t)$ is obtained, where $X(\omega,t)=[X_1(\omega,t), \ldots, X_N(\omega,t)]^T$, and $\omega$ represents any one of frequency bins $\omega_1$ to $\omega_M$. By repeating in this way, for each digital signal $s_i$, transformer 101 may transform a series of frames into frequency domain.

With respect to each unmixing filter $W(\omega_k,t)$ of unmixing filters $W(\omega_1,t)$ to $W(\omega_M,t)$ corresponding to respective frequency bins $\omega_1$ to $\omega_M$, calculator 102 calculates values $W_{ij}(\omega_k,t)$ of coefficients $W_{ij}(\omega,t)$ of the unmixing filter $W(\omega_k,t)$ by performing a gradient descent process on a cost function at least dependent on the coefficients $W_{ij}(\omega,t)$ of the unmixing filter $W(\omega,t)$.

To perform convolutive source separation, non-stationarity constraint is exploited. According to the non-stationarity constraint, it is possible to adopt a cost function $f(W(\omega,t))$ to evaluate decorrelation between the estimated source signals $Y_i(\omega,t) \in Y(\omega,t)$. If each of the estimated source signals includes less mixed components, the cost function $f(W(\omega,t))$ approaches a minimum value. Through a gradient descent process, it is possible to make the cost function $f(W(\omega,t))$ approach the minimum value in an iterative manner.

The gradient descent process is based on the observation that if a function $f(W(\omega,t))$ is defined and differentiable in a neighborhood of a point $W(\omega,t_0)$, then it decreases fastest if one goes in the direction of the negative gradient of $f(W(\omega,t))$ at $W(\omega,t_0) - \nabla f(W(\omega, t_0))$. It follows that, if $W(\omega,t_1) = W(\omega, t_0) - \mu \nabla f(W(\omega, t_0))$ for $\mu>0$ a small enough number (also called as a step size), then $f(W(\omega, t_0)) \geq f(W(\omega, t_1))$. In the following, the term $\mu \nabla f(W(\omega, t_i))$ is also called as a gradient term, which is the product of the step size $\mu$ and the gradient $\nabla f(W(\omega, t_i))$. With this observation, it is possible to start with a guess $W(\omega,t_0)$ for a local minimum of $f(W(\omega,t))$, and considers the sequence $W(\omega, t_0), W(\omega,t_1), W(\omega,t_2), \ldots$ such that $W(\omega,t_{n+1})=W(\omega,t_n)-\mu_n \nabla f(W(\omega, t_n))$, $n \geq 0$. It is possible to obtain $f(W(\omega, t_0)) \geq f(W(\omega, t_1)) \geq f(W(\omega, t_2)) \geq \ldots$, so hopefully the process converges to the desired local minimum.

For example, second-order statistics in the frequency domain is captured by the cross-power spectrum, $$R_{yy}(\omega, t) = E[Y(\omega, t)Y^H(\omega, t)] \quad (5)$$
$$= W(\omega, t)R_{xx}(\omega, t)W^H(\omega, t)$$

where $E[\cdot]$ denotes the statistical expectation, $W(\omega,t)$ is a matrix where non-diagonal elements are coefficients and diagonal elements are assumed as unit gains, and $R_{xx}(\omega, t)$ is the cross-power spectrum of microphone signals. For example, in the TITO case, $$R_{xx}(\omega, t) = \begin{bmatrix} R_{x1x1}(\omega, t) & R_{x1x2}(\omega, t) \\ R_{x2x1}(\omega, t) & R_{x2x2}(\omega, t) \end{bmatrix} \quad (6)$$

where $R_{xixj}(\omega,t)=X_i(\omega,t)X_j^*(\omega,t)$.

The goal is to minimize the cross-powers on the off-diagonal of this matrix, e.g. by minimizing the cost function:

$$J = \sum_{t,\omega} \|R_{yy}(\omega, t) - \Lambda_y(\omega, t)\|^2 \quad (7)$$

where $\Lambda_y(\omega, t)$ is the diagonal component of an estimate of the sources' cross-power spectrum. In this case, its gradients with respect to the real and imaginary parts are obtained by taking partial derivatives formally with respect to the conjugate quantities $W^*(\omega,t)$. Thus the gradient at time t is $$\frac{\partial J(t)}{\partial W^*(\omega, t)} = 2(W(\omega, t)R_{xx}(\omega, t)W^H(\omega, t) - \Lambda_y(\omega, t))W(\omega, t)R_{xx}(\omega, t) \quad (8)$$

and the unmixing filter is estimated as $$W(\omega, t+1) = W(\omega, t) - \mu(\omega, t)\frac{\partial J(t)}{\partial W^*(\omega, t)} \quad (9)$$

where $\mu(\omega, t)$ is the adaptation step size function that is made in inverse proportion to the input signal powers. Therefore, the gradient term is $$\mu(\omega, t)\frac{\partial J(t)}{\partial W^*(\omega, t)}.$$

For another example, in the TITO case, gradients may be simplified as cross-power of two estimated source signals. For example, the gradient for calculating the coefficient $W_{12}$ may be calculated as $Y_2^*(\omega, t)Y_1(\omega, t)$ and thus the corresponding gradient term is $$\mu_1(\omega,t)Y_2^*(\omega,t)Y_1(\omega,t) \quad (10).$$

The gradient for calculating the coefficient $W_{21}$ may be calculated as $Y_1^*(\omega, t)Y_2(\omega, t)$, and thus the corresponding gradient term is $$\mu_2(\omega,t)Y_1^*(\omega,t)Y_2(\omega,t) \quad (11),$$

where $\mu_1(\omega, t)$ and $\mu_2(\omega, t)$ are the adaptation step size functions that are made in inverse proportion to the input signal powers. For example, $$\mu(\omega) = \frac{c}{E[|X_1(\omega)|^2] + E[|X_2(\omega)|^2]} \quad (12)$$

where c is a constant.

In this way, for each non-diagonal elements (coefficients $W_{ij}(\omega,t)$, $i \neq j$) of the unmixing filter $W(\omega,t)$, a gradient descent process is performed.

If the convolutive problem is treated for each frequency bin as a separate problem, the source signals in each frequency bin may be estimated with an arbitrary permutation. If the permutation is not consistent across the frequency bins, then converting the signal back to the time domain will combine contributions from different sources into a single channel It is possible to solve the permutation problem (de-permutation) by putting a consistency (smoothness) constraint on gradient terms across the frequency bins. In each iteration of the gradient descent process, that is, for each time t, calculator 102 adjusts the gradient terms $\mu \nabla f(W_{ij}(\omega_1, t))$ to $\mu \nabla f(W_{ij}(\omega_M, t))$ for calculating the values of the same coefficient $W_{ij}$ of the unmixing filters $W(\omega_1,t)$ to $W(\omega_M,t)$ to improve smoothness of the gradient terms across the frequency bins $\omega_1$ to $\omega_M$. The coefficients subjected to the adjustment may be some or all of the coefficients of the unmixing filters. For example, the coefficients subjected to the adjustment may be non-diagonal coefficients of the unmixing filters.

Various methods may be used to improve the smoothness of the gradient terms across the frequency bins by adjusting the gradient terms.

In an example, with respect to each of the coefficients $W_{ij}(\omega,t)$, it is possible to transform the gradient terms $\mu \nabla f(W_{ij}(\omega_{i1}, t)), \ldots, \mu \nabla f(W_{ij}(w_{iM}, t))$ over the frequency bins $\omega_1$ to $\omega_M$ for calculating the values $W_{ij}(\omega_1, t)$ to $W_{ij}(\omega_M, t)$ of the coefficient $W_{ij}(\omega,t)$ into a time domain filter of length T, de-emphasize coefficients of the time domain filter at time indices t exceeding a threshold Q smaller than the length T, and transform coefficients of the time domain filter from time domain into frequency domain through a length-T transformation, so as to obtain adjusted gradient terms over the frequency bins $\omega_1$ to $\omega_M$. De-emphasizing may be implemented by setting the coefficients to zero, or multiplying the coefficients with respective weights smaller than 1 (for example, 0.1), that is, reducing the coefficients at time indices t exceeding the threshold Q relative to coefficients of the time domain filter not at time indices t exceeding the threshold Q.

Figure 2:
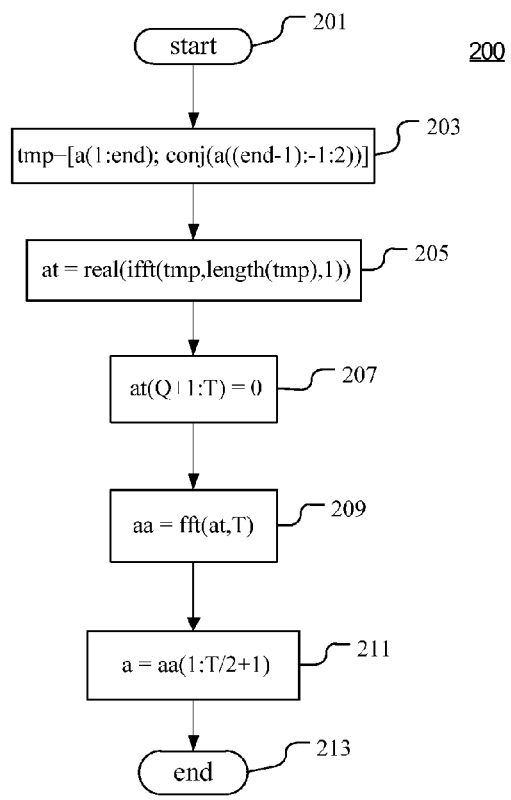
FIG. 2 is a flow chart illustrating an example method of adjusting gradient terms over frequency bins for calculating a coefficient.

FIG. 2 is a flow chart illustrating an example method 200 of adjusting gradient terms over frequency bins $\omega_1$ to $\omega_M$ for calculating a coefficient $W_{ij}$. In this example, the method is implemented in Matlab, where the frequency domain gradient includes 129 frequency bins, and the size of Fast Fourier Transformation (FFT) and the time domain filter are 256.

As illustrated in FIG. 2, method 200 starts from step 201. At step 203, an array tmp is formed of gradient terms $\mu \nabla f(W_{ij}(\omega_1, t)), \ldots, \mu \nabla f(W_{ij}(\omega_{129}, t))$ (in array $\alpha$) and complex conjugates of gradient terms $\mu \nabla f(W_{ij}(\omega_{128}, t)), \ldots, \mu \nabla f(W_{ij}(\chi_2, t))$.

At step 205, Inverse FFT of size 256 is performed on array tmp to obtain a time domain filter of length 256, and an array at is formed of the coefficients of the time domain filter.

At step 207, coefficients in array at at time indices from Q+1 to T are set to zero.

At step 209, FFT of size 256 is performed on array at to obtain an array aa formed of 256 new coefficients.

At step 211, array a is updated with the first 129 coefficients of array aa.

The method ends at step 213.

Figure 3:
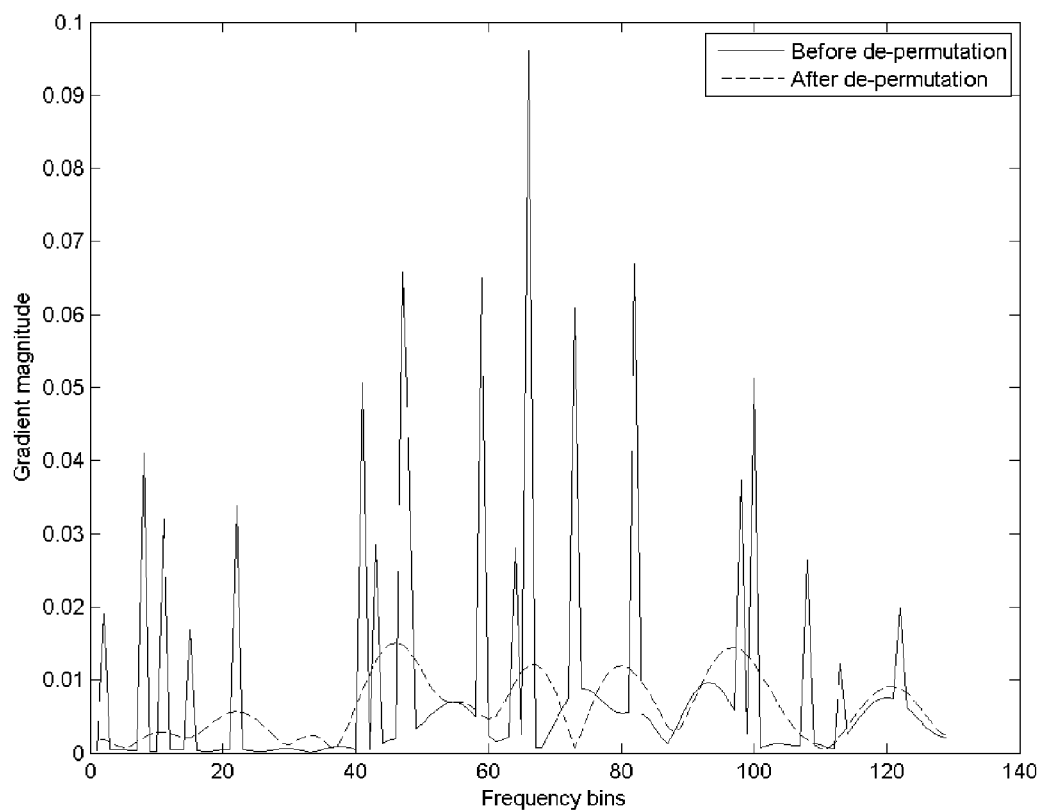
FIG. 3 is a graph demonstrating the effectiveness of the de-permutation to improve smoothness of gradient terms across the frequency bins through a comparison between magnitudes of the gradient terms before and after the de-permutation.

FIG. 3 is a graph demonstrating the effectiveness of the de-permutation to improve smoothness of gradient terms across the frequency bins through a comparison between magnitudes of the gradient terms before and after the de-permutation. As illustrated in FIG. 3, the magnitude before the de-permutation exhibits poor smoothness over frequency bins, and the magnitude after the de-permutation exhibits good smoothness over the frequency bins.

Returning to FIG. 1, calculator 102 provides unmixing filter $W(\omega,t)$ to estimator 103. With respect to each of the frequency bins, estimator 103 estimates source signals $Y(\omega,t)$ by filtering the transformed input signals $X(\omega,t)$ through the respective unmixing filter $W(\omega,t)$ configured with the calculated values of the coefficients. The process of estimator 103 can be represented with Equation (1).

Transformer 104 transforms the estimated source signals on the respective frequency bins into time domain, so as to produce separated source signals $S'_1$ to $S'_N$.

According to the embodiments, the de-permutation can be performed based on the gradient terms. This can be an alternative or addition to the de-permutation performed in other ways.

In a further embodiment of apparatus 100, calculator 102 may be further configured to adjust the threshold Q in at least one iteration of the gradient descent process. The at least one iteration may comprise arbitrary iteration, periodic iteration or every iteration.

In an example, the threshold Q may be adjusted according to the proportion of the unmixing filters in a divergence condition. In this case, if the proportion in the current iteration is higher, or higher than that in the previous iteration, the threshold Q which is smaller or smaller than that in the previous iteration is adopted, and if the proportion in the current iteration is lower, or lower than that in the previous iteration, the threshold Q which is greater or greater than that in the previous iteration is adopted. The divergence condition may be determined based on whether the unmixing filter is stable. In an example, the divergence condition of the unmixing filter corresponding to the respective frequency bin is determined if the power ratio of the output to the input of the unmixing filter is greater than a threshold D.

As an example, the power ratio Ratio may be represented as $$\text{Ratio} = \frac{E[|Y_1|^2]E[|Y_2|^2]}{E[|X_1|^2]E[|X_2|^2]} \quad (13)$$

or $$\text{Ratio} = \frac{E[|Y_1|^2] + E[|Y_2|^2]}{E[|X_1|^2] + E[|X_2|^2]} \quad (14)$$

The threshold D may be determined according to the requirement on the smoothness of the gradient terms. The higher requirement determines the smaller threshold D, and the lower requirement determines the greater threshold D. For example, the threshold D is equal to or smaller than 1.

In another example, the threshold Q may be adjusted according to the smoothness of the gradient terms between the frequency bins. In this case, the threshold Q is increased, e.g. to 2Q or the maximum length allowed if the smoothness is equal to or higher than a threshold P, and is reduced, e.g. to Q/2 if the smoothness is lower than the threshold P. Various measures may be used to evaluate the smoothness. For example, it is possible to calculate correlations of gradient terms between neighboring frequency bins and then average the correlations as the smoothness. The threshold P may be determined according to the requirement on the smoothness of the gradient terms. The higher requirement determines the higher threshold P, and the lower requirement determines the lower threshold P. In an example, the threshold P is equal to or greater than 0.5.

In another example, the threshold Q may be adjusted according to the consistency of the spectrum of the estimated source signals. In this case, the threshold Q is increased, e.g.

to 2Q or the maximum length allowed if the consistency is equal to or higher than a threshold G, and is reduced, e.g. to Q/2 if the consistency is lower than the threshold G. Various measures may be used to evaluate the consistency of the spectrum of the estimated source signals. For example, it is possible to calculate correlations of the estimated source signals between neighboring frequency bins and average the correlations as the consistency of the spectrum of the estimated source signals. The threshold G may be determined according to the requirement on the consistency of the spectrum. The higher requirement determines the higher threshold G, and the lower requirement determines the lower threshold G. In an example, the threshold G is equal to or greater than 0.5.

In a further embodiment of apparatus 100, calculator 102 may be further configured to adjust the gradient terms by choosing the permutation that minimizes the Euclidean distances or maximizes correlations of gradient terms between neighboring frequency bins. In this case, it is possible to try arbitrary permutations of the gradient terms and choose the permutation that minimizes the Euclidean distances or maximizes correlations of gradient terms between neighboring frequency bins. The Euclidean distances or correlations may be evaluated with their total sum or average.

In a further embodiment of apparatus 100, calculator 102 may be further configured to determine whether the unmixing filter corresponding to each of the frequency bins is in a divergence condition or not. The divergence condition may be determined based on whether the unmixing filter is stable. In an example, the divergence condition of the unmixing filter corresponding to the respective frequency bin is determined if the power ratio of the output to the input of the unmixing filter is greater than the threshold D.

Calculator 102 may be further configured to adopt the gradient terms calculated in the previous iteration as the gradient terms for use in the current iteration if the unmixing filter is in the divergence condition, and calculate the gradient terms for use in the current iteration if the unmixing filter is not in the divergence condition.

According to this embodiment, previous gradient terms are used for a particular frequency bin if the corresponding unmixing filter is deemed unstable, or new gradient terms are calculated if otherwise. Then the gradient terms are subjected to de-permutation. From Eqs. (5) and (6), it can be seen that such an approach may achieve a balance between maintaining existing filters (previously regularized) and adapting to the new gradient direction.

In a further embodiment of apparatus 100, in case of TITO, calculator 102 may be further configured to, with respect to each of the frequency bins co, calculate the gradient terms for use in the current iteration according to $$\nabla_{w_{12}} = \mu_1((X_1 X_1^* W_{21}^* + W_{12} X_2 X_1^* W_{21}^* + X_1 X_2^* + W_{12} X_2 X_2^*) Y_2 X_2^*). \quad (15)$$

$$\nabla_{w_{21}} = \mu_2((W_{21} X_1 X_1^* + X_2 X_1^* + W_{21} X_1 X_2^* W_{12}^* + X_2 X_2^* W_{12}^*) Y_1 X_1^*); \quad (16)$$

or according to $$\nabla_{w_{12}} = \mu_1(Y_1 Y_2^* (W_{21} X_1 X_2^* + X_2 X_2^*)), \quad (17)$$

$$\nabla_{w_{21}} = \mu_2(Y_2 Y_1^* (X_1 X_1^* + W_{12} X_2 X_1^*)), \quad (18)$$

or according to $$\nabla_{w_{12}} = \mu_1((X_1 + W_{12} X_2) Y_2^*), \quad (19)$$

$$\nabla_{w_{21}} = \mu_2((X_2 + W_{21} X_1) Y_1^*), \quad (20)$$

where
$\mu_1$ and $\mu_2$ are step size functions,
$\nabla_{w_{12}}$ is the gradient term for calculating the value of the coefficient $W_{12}$, $\nabla_{w_{21}}$ is the gradient term for calculating the value of the coefficient $W_{21}$,
$X_1$ and $X_2$ are the transformed input signals in the previous iteration respectively, $Y_1$ is the source signal estimated as $X_1 + W_{12} X_2$ in the previous iteration, $Y_2$ is the source signal estimated as $X_2 + W_{21} X_1$ in the previous iteration, and * represents complex conjugate.

Because at least some of calculations of XW are replaced with the filtered results, the calculating cost may be reduced. Further, by calculating the gradient terms based on Eqs. (10) and (11), the system can be simple, efficient and stable.

Figure 4:
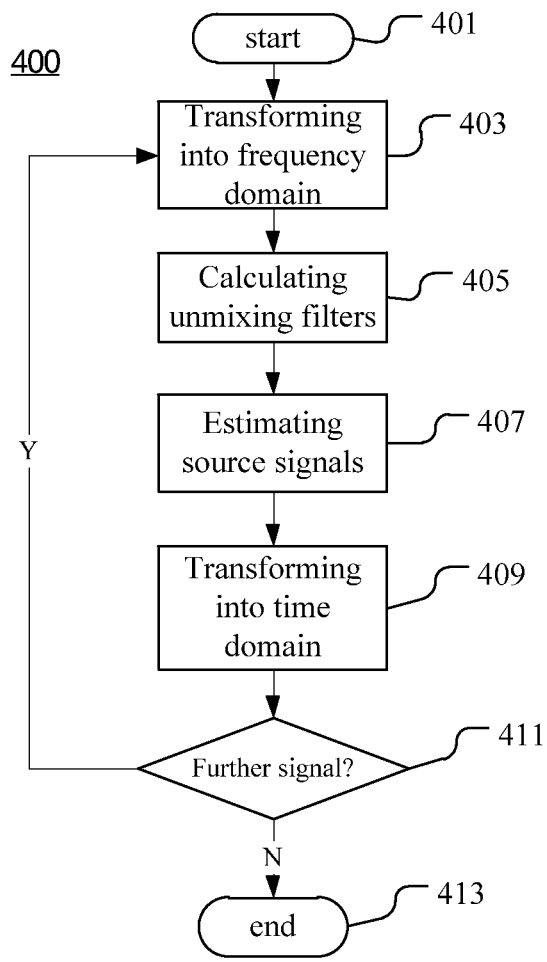
FIG. 4 is a flow chart illustrating an example method of performing convolutive blind source separation according to an embodiment of the present invention.

FIG. 4 is a flow chart illustrating an example method 400 of performing convolutive blind source separation according to an embodiment of the present invention.

As illustrated in FIG. 4, method 400 starts from step 401. At step 403, digital signals $s_1$ to $s_N$ obtained through respective microphones are transformed into frequency domain respectively. For example, from each digital signal $s_i$, it is possible to obtain a frame corresponding to time period from t to t+T, and convert the frame into frequency domain. Therefore, signals $X(\omega,t)$ is obtained, where $X(\omega,t) = [X_1(\omega,t), \ldots, X_N(\omega,t)]^T$, and $\omega$ represents any one of frequency bins $\omega_1$ to $\omega_M$. By repeating in this way, for each digital signal $s_i$, it is possible to transform a series of frames into frequency domain.

At step 405, with respect to each unmixing filter $W(\omega_k,t)$ of unmixing filters $W(\omega_1,t)$ to $W(\omega_M, t)$ corresponding to respective frequency bins $\omega_1$ to $\omega_M$, values $W_{ij}(\omega_k,t)$ of coefficients $W_{ij}(\omega,t)$ of the unmixing filter $W(\omega_k,t)$ are calculated by performing a gradient descent process on a cost function at least dependent on the coefficients $W_{ij}(\omega,t)$ of the unmixing filter $W(\omega,t)$.

To perform convolutive source separation, non-stationarity constraint is exploited. According to the non-stationarity constraint, it is possible to adopt a cost function $f(W(\omega, t))$ to evaluate decorrelation between the estimated source signals $Y_i(\omega,t) \in Y(\omega,t)$. If each of the estimated source signals includes less mixed components, the cost function $f(W(\omega,t))$ approaches a minimum value. Through a gradient descent process, it is possible to make the cost function $f(W(\omega,t))$ approach the minimum value in an iterative manner.

For example, second-order statistics in the frequency domain is captured by the cross-power spectrum in Eq. (5). The goal is to minimize the cross-powers on the off-diagonal of this matrix, e.g. by minimizing the cost function in Eq. (7). In this case, its gradients with respect to the real and imaginary parts are obtained by taking partial derivatives formally with respect to the conjugate quantities $W^*(\omega,t)$. Thus the gradient at time t is estimated as in Eq. (8) and the unmixing filter is estimated as in Eq. (9).

For another example, in the TITO case, the gradients may be simplified as cross-power of two estimated source signals. For example, the gradient term for calculating the coefficient $W_{12}$ may be calculated based on Eq. (10), and the gradient term for calculating the coefficient $W_{21}$ may be calculated based on Eq. (11).

In this way, for each non-diagonal elements (coefficients $W_{ij}(\omega,t)$, $i \neq j$) of the unmixing filter $W(\omega,t)$, a gradient descent process is performed.

It is possible to solve the permutation problem (de-permutation) by putting a consistency (smoothness) constraint on gradient terms across the frequency bins. In each iteration of the gradient descent process, that is, for each time t, the gradient terms $\mu \nabla f(W_{ij}(\omega_1, t))$ to $\mu \nabla f(W_{ij}(\omega_M, t))$ for calculating the values of the same coefficient $W_{ij}$ of the unmixing filters $W(\omega_1,t)$ to $W(\omega_M,t)$ are adjusted to improve smoothness of the gradient terms across the frequency bins $\omega_1$ to $\omega_M$. The coefficients subjected to the adjustment may be some or all of the coefficients of the unmixing filters. For example, the coefficients subjected to the adjustment may be non-diagonal coefficients of the unmixing filters.

Various methods may be used to improve the smoothness of the gradient terms across the frequency bins by adjusting the gradient terms.

In an example, with respect to each of the coefficients $W_{ij}(\omega,t)$, it is possible to transform the gradient terms $\mu\nabla f(W_{ij}(\omega_{i1},t)), \ldots, \mu\nabla f(W_{ij}(\omega_{iM},t))$ over the frequency bins $\omega_1$ to $\omega_M$ for calculating the values $W_{ij}(\omega_1,t)$ to $W_{ij}(\omega_M,t)$ of the coefficient $W_{ij}(\omega,t)$ into a time domain filter of length T, de-emphasize coefficients of the time domain filter at time indices t exceeding a threshold Q smaller than the length T, and transform coefficients of the time domain filter from time domain into frequency domain through a length-T transformation, so as to obtain adjusted gradient terms over the frequency bins $\omega_1$ to $\omega_M$. De-emphasizing may be implemented by setting the coefficients to zero, or multiplying the coefficients with respective weights smaller than 1 (for example, 0.1), that is, reducing the coefficients at time indices t exceeding the threshold Q relative to coefficients of the time domain filter not at time indices t exceeding the threshold Q.

The unmixing filter $W(\omega,t)$ obtained at step 405 is used at step 407. At step 407, with respect to each of the frequency bins, source signals $Y(\omega,t)$ are estimated by filtering the transformed input signals $X(\omega,t)$ through the respective unmixing filter $W(\omega,t)$ configured with the calculated values of the coefficients. The process of step 407 can be represented with Equation (1).

At step 409, the estimated source signals on the respective frequency bins are transformed into time domain, so as to produce separated source signals $S'_1$ to $S'_N$.

At step 411, it is determined whether there are other digital signals to be processed. If YES, the process returns to step 403. If NO, method 400 ends at step 413.

In a further embodiment of method 400, step 405 may further comprise adjusting the threshold Q in at least one iteration of the gradient descent process. The at least one iteration may comprises arbitrary iteration, periodic iteration or every iteration.

In an example, the threshold Q may be adjusted according to the proportion of the unmixing filters in a divergence condition. In this case, if the proportion in the current iteration is higher, or higher than that in the previous iteration, the threshold Q which is smaller or smaller than that in the previous iteration is adopted, and if the proportion in the current iteration is lower, or lower than that in the previous iteration, the threshold Q which is greater or greater than that in the previous iteration is adopted. The divergence condition may be determined based on whether the unmixing filter is stable. In an example, the divergence condition of the unmixing filter corresponding to the respective frequency bin is determined if the power ratio of the output to the input of the unmixing filter is greater than a threshold D.

The threshold D may be determined according to the requirement on the smoothness of the gradient terms. The higher requirement determines the smaller threshold D, and the lower requirement determines the greater threshold D. For example, the threshold D is equal to or smaller than 1.

In another example, the threshold Q may be adjusted according to the smoothness of the gradient terms between the frequency bins. In this case, the threshold Q is increased, e.g. to 2Q or the maximum length allowed if the smoothness is equal to or higher than a threshold P, and is reduced, e.g. to Q/2 if the smoothness is lower than the threshold P. Various measures may be used to evaluate the smoothness. For example, it is possible to calculate correlations of gradient terms between neighboring frequency bins and then average the correlations as the smoothness. The threshold P may be determined according to the requirement on the smoothness of the gradient terms. The higher requirement determines the higher threshold P, and the lower requirement determines the lower threshold P. In an example, the threshold P is equal to or greater than 0.5.

In another example, the threshold Q may be adjusted according to the consistency of the spectrum of the estimated source signals. In this case, the threshold Q is increased, e.g. to 2Q or the maximum length allowed if the consistency is equal to or higher than a threshold G, and is reduced, e.g. to Q/2 if the consistency is lower than the threshold G. Various measures may be used to evaluate the consistency of the spectrum of the estimated source signals. For example, it is possible to calculate correlations of the estimated source signals between neighboring frequency bins and average the correlations as the consistency of the spectrum of the estimated source signals. The threshold G may be determined according to the requirement on the consistency of the spectrum. The higher requirement determines the higher threshold G, and the lower requirement determines the lower threshold G. In an example, the threshold G is equal to or greater than 0.5.

In a further embodiment of method 400, step 405 may further comprise adjusting the gradient terms by choosing the permutation that minimizes the Euclidean distances or maximizes correlations of gradient terms between neighboring frequency bins. In this case, it is possible to try arbitrary permutations of the gradient terms and choose the permutation that minimizes the Euclidean distances or maximizes correlations of gradient terms between neighboring frequency bins. The Euclidean distances or correlations may be evaluated with their total sum or average.

In a further embodiment of method 400, step 405 may further comprise determining whether the unmixing filter corresponding to each of the frequency bins is in a divergence condition or not. The divergence condition may be determined based on whether the unmixing filter is stable. In an example, the divergence condition of the unmixing filter corresponding to the respective frequency bin is determined if the power ratio of the output to the input of the unmixing filter is greater than the threshold D.

In this case, step 405 may further comprise adopting the gradient terms calculated in the previous iteration as the gradient terms for use in the current iteration if the unmixing filter is in the divergence condition, and calculating the gradient terms for use in the current iteration if the unmixing filter is not in the divergence condition.

According to this embodiment, previous gradient terms are used for a particular frequency bin if the corresponding unmixing filter is deemed unstable, or new gradient terms are calculated if otherwise. Then the gradient terms are subjected to de-permutation. From Eqs. (5) and (6), it can be seen that such an approach may achieve a balance between maintaining existing filters (previously regularized) and adapting to the new gradient direction.

In a further embodiment of method 400, in case of TITO, step 405 may further comprise, with respect to each of the frequency bins $\omega$, calculating the gradient terms for use in the current iteration according to Eqs. (15) and (16), or according to Eqs. (17) and (18), or according to Eqs. (19) and (20).

Figure 5:
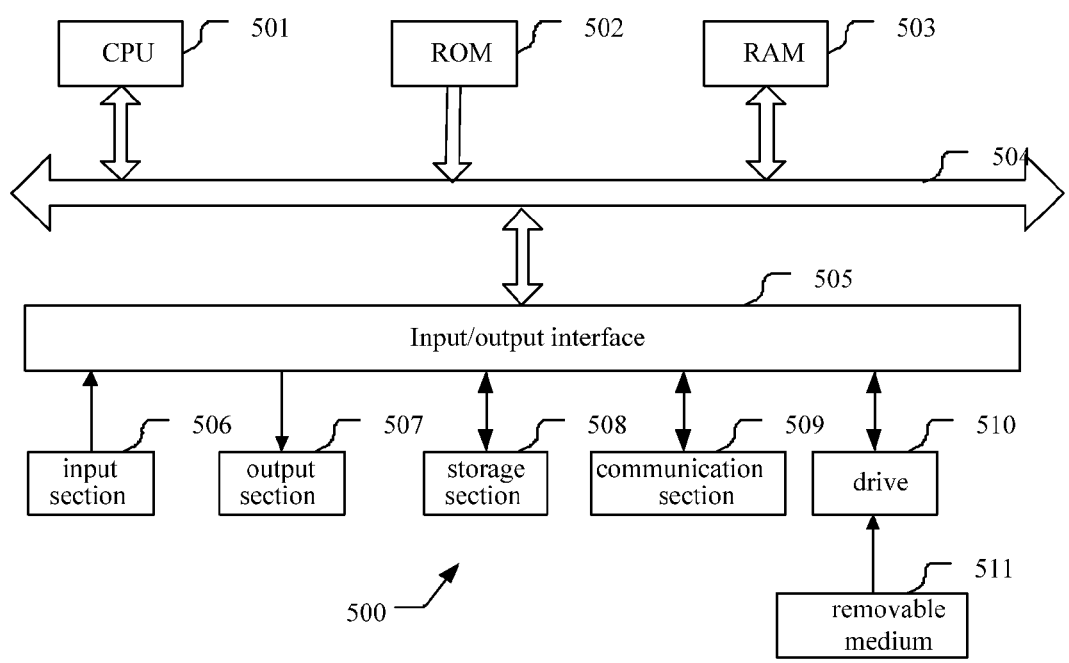
FIG. 5 is a block diagram illustrating an exemplary system for implementing aspects of the present invention.

FIG. 5 is a block diagram illustrating an exemplary system for implementing the aspects of the present invention.

In FIG. 5, a central processing unit (CPU) 501 performs various processes in accordance with a program stored in a read only memory (ROM) 502 or a program loaded from a storage section 508 to a random access memory (RAM) 503. In the RAM 503, data required when the CPU 501 performs the various processes or the like is also stored as required.

The CPU 501, the ROM 502 and the RAM 503 are connected to one another via a bus 504. An input/output interface 505 is also connected to the bus 504.

The following components are connected to the input/output interface 505: an input section 506 including a keyboard, a mouse, or the like; an output section 507 including a display such as a cathode ray tube (CRT), a liquid crystal display (LCD), or the like, and a loudspeaker or the like; the storage section 508 including a hard disk or the like; and a communication section 509 including a network interface card such as a LAN card, a modem, or the like. The communication section 509 performs a communication process via the network such as the internet.

A drive 510 is also connected to the input/output interface 505 as required. A removable medium 511, such as a magnetic disk, an optical disk, a magneto-optical disk, a semiconductor memory, or the like, is mounted on the drive 510 as required, so that a computer program read therefrom is installed into the storage section 508 as required.

In the case where the above-described steps and processes are implemented by the software, the program that constitutes the software is installed from the network such as the internet or the storage medium such as the removable medium 511.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The following exemplary embodiments (each an "EE") are described.

EE 1. A method of performing convolutive blind source separation, comprising:

transforming each of a plurality of input signals into frequency domain;

calculating values of coefficients of unmixing filters corresponding to frequency bins by performing a gradient descent process on a cost function at least dependent on the coefficients of the unmixing filters, wherein in each iteration of the gradient descent process, gradient terms for calculating the values of the same coefficient of the unmixing filters are adjusted to improve smoothness of the gradient terms across the frequency bins;

with respect to each of the frequency bins, estimating source signals by filtering the transformed input signals through the respective unmixing filter configured with the calculated values of the coefficients; and transforming the estimated source signals on the respective frequency bins into time domain, wherein the cost function is adapted to evaluate decorrelation between the estimated source signals.

EE 2. The method according to EE1, wherein the number of the plurality of input signals is two.

EE 3. The method according to EE2, wherein with respect to each of the frequency bins, the gradient terms for use in the current iteration are calculated according to one of the following methods:

$$\nabla_{w_{12}} = \mu_1((X_1 X_1^* W_{21}^* + W_{12} X_2 X_1^* W_{21}^* + X_1 X_2^* + W_{12} X_2 X_2^*) Y_2 X_2^*),$$

$$\nabla_{w_{21}} = \mu_2((W_{21} X_1 X_1^* + X_2 X_1^* + W_{21} X_1 X_2^* W_{12}^* + X_2 X_2^* W_{12}^*) Y_1 X_1^*);$$

$$\nabla_{w_{12}} = \mu_1(Y_1 Y_2^*(W_{21} X_1 X_2^* + X_2 X_2^*)),$$

$$\nabla_{w_{21}} = \mu_2(Y_2 Y_1^*(X_1 X_1^* + W_{12} X_2 X_1^*)); \text{ and}$$

$$\nabla_{w_{12}} = \mu_1((X_1 + W_{12} X_2) Y_2^*),$$

$$\nabla_{w_{21}} = \mu_2((X_2 + W_{21} X_1) Y_1^*),$$

where $\mu_1$ and $\mu_2$ are step size functions, $\nabla_{w_{12}}$ is the gradient term for calculating the value of the coefficient $W_{12}$, $\nabla_{w_{21}}$ is the gradient term for calculating the value of the coefficient $W_{21}$, $X_1$ and $X_2$ are the transformed input signals in the previous iteration respectively, $Y_1$ is the source signal estimated as $X_1 + W_{12} X_2$ in the previous iteration, $Y_2$ is the source signal estimated as $X_2 + W_{21} X_1$ in the previous iteration, and * represents complex conjugate.

EE 4. The method according to EE2, wherein with respect to each of the frequency bins, the gradient terms for use in the current iteration are calculated as $$\nabla_1 = \mu_1 Y_1 Y_2^*,$$

$$\nabla_2 = \mu_2 Y_2 Y_1^*;$$

where $\mu_1$ and $\mu_2$ are step size functions, $\nabla_1$ is the gradient term for calculating the value of the coefficient $W_{12}$, $\nabla_2$ is the gradient term for calculating the value of the coefficient $W_{21}$, $Y_1$ is the source signal estimated as $X_1 + W_{12} X_2$ in the previous iteration, $Y_2$ is the source signal estimated as $X_2 + W_{21} X_1$ in the previous iteration, and * represents complex conjugate.

EE 5. The method according to EE1, wherein with respect to each of the frequency bins, the calculating of the values comprises:

determining whether the unmixing filter is in a divergence condition or not;

if the unmixing filter is in the divergence condition, adopting the gradient terms calculated in the previous iteration as the gradient terms for use in the current iteration; and if the unmixing filter is not in the divergence condition, calculating the gradient terms for use in the current iteration.

EE 6. The method according to EE1, wherein the adjusting comprises:

with respect to each of the coefficients, transforming the gradient terms over the frequency bins for calculating the coefficient into a time domain filter of length T;

de-emphasizing coefficients of the time domain filter at time indices exceeding a first threshold smaller than the length T; and transforming coefficients of the time domain filter from time domain into frequency domain through a length-T transformation.

EE 7. The method according to EE6, wherein the de-emphasizing of the coefficients comprises zeroing the coefficients at time indices exceeding the first threshold, or reducing the coefficients at time indices exceeding the first threshold relative to coefficients of the time domain filter not at time indices exceeding the first threshold.

EE 8. The method according to EE6, wherein the first threshold is adjusted in at least one iteration of the gradient descent process according to the proportion of the unmixing filters in a divergence condition, where the higher the proportion is, the smaller the first threshold is.

EE 9. The method according to EE6, wherein the first threshold is adjusted in at least one iteration of the gradient descent process according to the smoothness, where the first threshold is increased if the smoothness is equal to or higher than a second threshold, and is reduced if the smoothness is lower than the second threshold.

EE 10. The method according to EE9, wherein the smoothness is evaluated by calculating correlations of gradient terms between neighboring frequency bins and then averaging the correlations.

EE 11. The method according to EE10, wherein the second threshold is equal to or greater than 0.5.

EE 12. The method according to EE6, wherein the first threshold is adjusted in at least one iteration of the gradient descent process according to consistency of the spectrum of the estimated source signals, where the first threshold is increased if the consistency is equal to or higher than a third threshold, and is reduced if the consistency is lower than the third threshold.

EE 13. The method according to EE11, wherein the consistency is evaluated by calculating correlations of the estimated source signals between neighboring frequency bins and averaging the correlations.

EE 14. The method according to EE13, wherein the third threshold is equal to or greater than 0.5.

EE 15. The method according to EE5 or 8, wherein the divergence condition of the unmixing filter is determined if the power ratio of the output to the input of the unmixing filter is greater than a fourth threshold.

EE 16. The method according to EE15, wherein the fourth threshold is equal to or smaller than 1.

EE 17. The method according to EE1, wherein the gradient terms are adjusted by choosing one of permutations that minimizes the Euclidean distances or maximizes correlations of gradient terms between neighboring frequency bins.

EE 18. An apparatus for performing convolutive blind source separation, comprising:

a first transformer which transforms each of a plurality of input signals into frequency domain;

a calculator which calculates values of coefficients of unmixing filters corresponding to frequency bins by performing a gradient descent process on a cost function at least dependent on the coefficients of the unmixing filters, wherein in each iteration of the gradient descent process, gradient terms for calculating the values of the same coefficient of the unmixing filter are adjusted to improve smoothness of the gradient terms across the frequency bins;

an estimator which, with respect to each of the frequency bins, estimates source signals by filtering the transformed input signals through the respective unmixing filter configured with the calculated values of the coefficients; and a second transformer which transforms the estimated source signals on the respective frequency bins into time domain, wherein the cost function is adapted to evaluate decorrelation between the estimated source signals.

EE 19. The apparatus according to EE18, wherein the number of the plurality of input signals is two.

EE 20. The apparatus according to EE19, wherein the calculator is configured to, with respect to each of the frequency bins, calculate the gradient terms for use in the current iteration according to one of the following methods:

$$\nabla_{w_{12}} = \mu_1((X_1X_1^*W_{21}^* + W_{12}X_2X_1^*W_{21}^* + X_1X_2^* + W_{12}X_2X_2^*)Y_2X_2^*),$$

$$\nabla_{w_{21}} = \mu_2((W_{21}X_1X_1^* + X_2X_1^* + W_{21}X_1X_2^*W_{12}^* + X_2X_2^*W_{12}^*)Y_1X_1^*);$$

$$\nabla_{w_{12}} = \mu_1(Y_1Y_2^*(W_{21}X_1X_2^* + X_2X_2^*)),$$

$$\nabla_{w_{21}} = \mu_2(Y_2Y_1^*(X_1X_1^* + W_{12}X_2X_1^*)); \text{ and}$$

$$\nabla_{w_{12}} = \mu_1((X_1 + W_{12}X_2)Y_2^*),$$

$$\nabla_{w_{21}} = \mu_2((X_2 + W_{21}X_1)Y_1^*),$$

where $\mu_1$ and $\mu_2$ are step size functions, $\nabla_{w_{12}}$ is the gradient term for calculating the value of the coefficient $W_{12}$, $\nabla_{w_{21}}$ is the gradient term for calculating the value of the coefficient $W_{21}$, $X_1$ and $X_2$ are the transformed input signals in the previous iteration respectively, $Y_1$ is the source signal estimated as $X_1 + W_{12}X_2$ in the previous iteration, $Y_2$ is the source signal estimated as $X_2 + W_{21}X_1$ in the previous iteration, and * represents complex conjugate.

EE 21. The apparatus according to EE19, wherein the calculator is configured to, with respect to each of the frequency bins, calculate the gradient terms for use in the current iteration as $$\nabla_1 = \mu_1 Y_1 Y_2^*,$$

$$\nabla_2 = \mu_2 Y_2 Y_1^*;$$

where $\mu_1$ and $\mu_2$ are step size functions, $\nabla_1$ is the gradient term for calculating the value of the coefficient $W_{12}$, $\nabla_2$ is the gradient term for calculating the value of the coefficient $W_{21}$, $Y_1$ is the source signal estimated as $X_1 + W_{12}X_2$ in the previous iteration, $Y_2$ is the source signal estimated as $X_2 + W_{21}X_1$ in the previous iteration, and * represents complex conjugate.

EE 22. The apparatus according to EE18, wherein the calculator is further configured to, with respect to each of the frequency bins, determine whether the unmixing filter is in a divergence condition or not, adopt the gradient terms calculated in the previous iteration as the gradient terms for use in the current iteration if the unmixing filter is in the divergence condition, and calculate the gradient terms for use in the current iteration if the unmixing filter is not in the divergence condition.

EE 23. The apparatus according to EE18, wherein the calculator is configured to, with respect to each of the coefficients, transform the gradient terms over the frequency bins for calculating the coefficient into a time domain filter of length T, de-emphasize coefficients of the time domain filter at time indices exceeding a first threshold smaller than the length T, and transform coefficients of the time domain filter from time domain into frequency domain through a length-T transformation.

EE 24. The apparatus according to EE23, wherein the de-emphasizing of the coefficients comprises zeroing the coefficients at time indices exceeding the first threshold, or reducing the coefficients at time indices exceeding the first threshold relative to coefficients of the time domain filter not at time indices exceeding the first threshold.

EE 25. The apparatus according to EE23, wherein the calculator is further configured to adjust the first threshold in at least one iteration of the gradient descent process according to the proportion of the unmixing filters in a divergence condition, where the higher the proportion is, the smaller the first threshold is.

EE 26. The apparatus according to EE23, wherein the calculator is further configured to adjust the first threshold in at least one iteration of the gradient descent process according to the smoothness, where the first threshold is increased if the smoothness is equal to or higher than a second threshold, and is reduced if the smoothness is lower than the second threshold.

EE 27. The apparatus according to EE26, wherein the smoothness is evaluated by calculating correlations of gradient terms between neighboring frequency bins and then averaging the correlations.

EE 28. The apparatus according to EE27, wherein the second threshold is equal to or greater than 0.5.

EE 29. The apparatus according to EE23, wherein the calculator is further configured to adjust the first threshold in at least one iteration of the gradient descent process according to consistency of the spectrum of the estimated source signals, where the first threshold is increased if the consistency is equal to or higher than a third threshold, and is reduced if the consistency is lower than the third threshold.

EE 30. The apparatus according to EE29, wherein the consistency is evaluated by calculating correlations of the estimated source signals between neighboring frequency bins and averaging the correlations.

EE 31. The apparatus according to EE30, wherein the third threshold is equal to or greater than 0.5.

EE 32. The apparatus according to EE22 or 25, wherein the divergence condition of the unmixing filter is determined if the power ratio of the output to the input of the unmixing filter is greater than a fourth threshold.

EE 33. The apparatus according to EE32, wherein the fourth threshold is equal to or smaller than 1.

EE 34. The apparatus according to EE18, wherein the calculator is further configured to adjust the gradient terms by choosing one of permutations that minimizes the Euclidean distances or maximizes correlations of gradient terms between neighboring frequency bins.

EE 35. A computer-readable medium having computer program instructions recorded thereon, when being executed by a processor, the instructions enabling the processor to perform a method of convolutive blind source separation based on second order statistics comprising:

transforming each of a plurality of input signals into frequency domain;

calculating values of coefficients of unmixing filters corresponding to frequency bins by performing a gradient descent process on a cost function at least dependent on the coefficients of the unmixing filters, wherein in each iteration of the gradient descent process, gradient terms for calculating the values of the same coefficient of the unmixing filters are adjusted to improve smoothness of the gradient terms across the frequency bins;

with respect to each of the frequency bins, estimating source signals by filtering the transformed input signals through the respective unmixing filter configured with the calculated values of the coefficients; and transforming the estimated source signals on the respective frequency bins into time domain, wherein the cost function is adapted to evaluate decorrelation between the estimated source signals.

I claim:

1. A method of performing convolutive blind source separation, comprising:

transforming each of a plurality of input signals into frequency domain;

calculating values of coefficients of unmixing filters corresponding to frequency bins by performing a gradient descent process on a cost function at least dependent on the coefficients of the unmixing filters, wherein in each iteration of the gradient descent process, gradient terms for calculating the values of the same coefficient of the unmixing filters are adjusted to improve smoothness of the gradient terms across the frequency bins;

wherein the adjusting comprises:

with respect to each of the coefficients, transforming the terms over the frequency bins for calculating the coefficient into a time domain filter of length T;

de-emphasizing coefficients of the time domain filter at time indices exceeding a first threshold smaller than the length T; and transforming coefficients of the time domain filter from time domain into frequency domain through a length-T transformation;

with respect to each of the frequency bins, estimating source signals by filtering the transformed input signals through the respective unmixing filter configured with the calculated values of the coefficients; and transforming the estimated source signals on the respective frequency bins into time domain;

wherein the cost function is adapted to evaluate decorrelation between the estimated source signals;

wherein the method is performed by one or more computing devices.

2. The method according to claim 1, wherein the number of the plurality of input signals is two.

3. The method according to claim 2, wherein with respect to each of the frequency bins, the gradient terms for use in the current iteration are calculated according to one of the following methods:

$$\nabla_{w_{12}} = \mu_1((X_1X_1^*W_{21}^* + W_{12}X_2X_1^*W_{21}^* + X_1X_2^* + W_{12}X_2X_2^*)Y_2X_2^*),$$

$$\nabla_{w_{21}} = \mu_2((W_{21}X_1X_1^* + X_2X_1^* + W_{21}X_1X_2^*W_{12}^* + X_2X_2^*W_{12}^*)Y_1X_1^*);$$

$$\nabla_{w_{12}} = \mu_1(Y_1Y_2^*(W_{21}X_1X_2^* + X_2X_2^*)),$$

$$\nabla_{w_{21}} = \mu_2(Y_2Y_1^*(X_1X_1^* + W_{12}X_2X_1^*)); \text{ and}$$

$$\nabla_{w_{12}} = \mu_1((X_1 + W_{12}X_2)Y_2^*),$$

$$\nabla_{w_{21}} = \mu_2((X_2 + W_{21}X_1)Y_1^*),$$

where $\mu_1$ and $\mu_2$ are step size functions, $\nabla_{w_{12}}$ is the gradient term for calculating the value of the coefficient $W_{12}$, $\nabla_{w_{21}}$ is the gradient term for calculating the value of the coefficient $W_{21}$, $X_1$ and $X_2$ are the transformed input signals in the previous iteration respectively, $Y_1$ is the source signal estimated as $X_1+W_{12}X_2$ in the previous iteration, $Y_2$ is the source signal estimated as $X_2+W_{21}X_1$ in the previous iteration, and * represents complex conjugate.

4. The method according to claim 2, wherein with respect to each of the frequency bins, the gradient terms for use in the current iteration are calculated as $$\nabla_1 = \mu_1 Y_1 Y_2^*,$$

$$\nabla_2 = \mu_2 Y_2 Y_1^*;$$

where $\mu_1$ and $\mu_2$ are step size functions, $\nabla_1$ is the gradient term for calculating the value of the coefficient $W_{12}$, $\nabla_2$ is the gradient term for calculating the value of the coefficient $W_{21}$, $Y_1$ is the source signal estimated as $X_1+W_{12}X_2$ in the previous iteration, $Y_2$ is the source signal estimated as $X_2+W_{21}X_1$ in the previous iteration, and * represents complex conjugate.

5. The method according to claim 1, wherein with respect to each of the frequency bins, the calculating of the values comprises:

determining whether the unmixing filter is in a divergence condition or not;

if the unmixing filter is in the divergence condition, adopting the gradient terms calculated in the previous iteration as the gradient terms for use in the current iteration; and if the unmixing filter is not in the divergence condition, calculating the gradient terms for use in the current iteration.

6. The method according to claim 1, wherein the de-emphasizing of the coefficients comprises zeroing the coefficients at time indices exceeding the first threshold, or reducing the coefficients at time indices exceeding the first threshold relative to coefficients of the time domain filter not at time indices exceeding the first threshold.

7. The method according to claim 1, wherein the first threshold is adjusted in at least one iteration of the gradient descent process according to the proportion of the unmixing filters in a divergence condition, where the higher the proportion is, the smaller the first threshold is.

8. The method according to claim 1, wherein the first threshold is adjusted in at least one iteration of the gradient descent process according to the smoothness, where the first threshold is increased if the smoothness is equal to or higher than a second threshold, and is reduced if the smoothness is lower than the second threshold.

9. The method according to claim 1, wherein the gradient terms are adjusted by choosing one of permutations that minimizes the Euclidean distances or maximizes correlations of gradient terms between neighboring frequency bins.

10. An apparatus for performing convolutive blind source separation, comprising:

a first transformer, at least implemented in part in hardware, which transforms each of a plurality of input signals into frequency domain;

a calculator, at least implemented in part in hardware, which calculates values of coefficients of unmixing filters corresponding to frequency bins by performing a gradient descent process on a cost function at least dependent on the coefficients of the unmixing filters, wherein in each iteration of the gradient descent process, gradient terms for calculating the values of the same coefficient of the unmixing filter are adjusted to improve smoothness of the gradient terms across the frequency bins;

wherein the calculator is configured to, with respect to each of the coefficients, transform the gradient terms over the frequency bins for calculating the coefficient into a time domain filter of length T, de-emphasize coefficients of the time domain filter at time indices exceeding a first threshold smaller than the length T, and transform coefficients of the time domain filter from time domain into frequency domain through a length-T transformation;

an estimator, at least implemented in part in hardware, which, with respect to each of the frequency bins, estimates source signals by filtering the transformed input signals through the respective unmixing filter configured with the calculated values of the coefficients; and a second transformer, at least implemented in part in hardware, which transforms the estimated source signals on the respective frequency bins into time domain, wherein the cost function is adapted to evaluate decorrelation between the estimated source signals.

11. The apparatus according to claim 10, wherein the number of the plurality of input signals is two.

12. The apparatus according to claim 11, wherein the calculator is configured to, with respect to each of the frequency bins, calculate the gradient terms for use in the current iteration according to one of the following methods:

$$\nabla_{w_{12}} = \mu_1((X_1 X_1^* W_{21}^* + W_{12} X_2 X_1^* W_{21}^* + X_1 X_2^* + W_{12} X_2 X_2^*) Y_2 X_2^*),$$

$$\nabla_{w_{21}} = \mu_2((W_{21} X_1 X_1^* + X_2 X_1^* + W_{21} X_1 X_2^* W_{12}^* + X_2 X_2^* W_{12}^*) Y_1 X_1^*);$$

$$\nabla_{w_{12}} = \mu_1(Y_1 Y_2^*(W_{21} X_1 X_2^* + X_2 X_2^*)),$$

$$\nabla_{w_{21}} = \mu_2(Y_2 Y_1^*(X_1 X_1^* + W_{12} X_2 X_1^*)); \text{ and}$$

$$\nabla_{w_{12}} = \mu_1((X_1 + W_{12} X_2) Y_2^*),$$

$$\nabla_{w_{21}} = \mu_2((X_2 + W_{21} X_1) Y_1^*),$$

where $\mu_1$ and $\mu_2$ are step size functions, $\nabla_{w_{12}}$ is the gradient term for calculating the value of the coefficient $W_{12}$, $\nabla w_{21}$ is the gradient term for calculating the value of the coefficient $W_{21}$, $X_1$ and $X_2$ are the transformed input signals in the previous iteration respectively, $Y_1$ is the source signal estimated as $X_1+W_{12}X_2$ in the previous iteration, $Y_2$ is the source signal estimated as $X_2+W_{21}X_1$ in the previous iteration, and * represents complex conjugate.

13. The apparatus according to claim 11, wherein the calculator is configured to, with respect to each of the frequency bins, calculate the gradient terms for use in the current iteration as $$\nabla_1 = \mu_1 Y_1 Y_2^*,$$

$$\nabla_2 = \mu_2 Y_2 Y_1^*;$$

where $\mu_1$ and $\mu_2$ are step size functions, $\nabla_1$ is the gradient term for calculating the value of the coefficient $W_{12}$, $\nabla_2$ is the gradient term for calculating the value of the coefficient $W_{21}$, $Y_1$ is the source signal estimated as $X_1+W_{12}X_2$ in the previous iteration, $Y_2$ is the source signal estimated as $X_2+W_{21}X_1$ in the previous iteration, and * represents complex conjugate.

14. The apparatus according to claim 10, wherein the calculator is further configured to, with respect to each of the frequency bins, determine whether the unmixing filter is in a divergence condition or not, adopt the gradient terms calculated in the previous iteration as the gradient terms for use in the current iteration if the unmixing filter is in the divergence condition, and calculate the gradient terms for use in the current iteration if the unmixing filter is not in the divergence condition.

15. The apparatus according to claim 10, wherein the de-emphasizing of the coefficients comprises zeroing the coefficients at time indices exceeding the first threshold, or reducing the coefficients at time indices exceeding the first threshold relative to coefficients of the time domain filter not at time indices exceeding the first threshold.

16. The apparatus according to claim 10, wherein the calculator is further configured to adjust the first threshold in at least one iteration of the gradient descent process according to the proportion of the unmixing filters in a divergence condition, where the higher the proportion is, the smaller the first threshold is.

17. The apparatus according to claim 10, wherein the calculator is further configured to adjust the first threshold in at least one iteration of the gradient descent process according to the smoothness, where the first threshold is increased if the smoothness is equal to or higher than a second threshold, and is reduced if the smoothness is lower than the second threshold.

18. The apparatus according to claim 10, wherein the calculator is further configured to adjust the gradient terms by choosing one of permutations that minimizes the Euclidean distances or maximizes correlations of gradient terms between neighboring frequency bins.

19. A non-transitory computer-readable storage medium having computer program instructions recorded thereon, when being executed by a processor, the instructions enabling the processor to perform a method of convolutive blind source separation based on second order statistics comprising:
  transforming each of a plurality of input signals into frequency domain;
  calculating values of coefficients of unmixing filters corresponding to frequency bins by performing a gradient descent process on a cost function at least dependent on the coefficients of the unmixing filters, wherein in each iteration of the gradient descent process, gradient terms for calculating the values of the same coefficient of the unmixing filters are adjusted to improve smoothness of the gradient terms across the frequency bins;
  wherein the adjusting comprises:
    with respect to each of the coefficients, transforming the terms over the frequency bins for calculating the coefficient into a time domain filter of length T;
    de-emphasizing coefficients of the time domain filter at time indices exceeding a first threshold smaller than the length T; and
    transforming coefficients of the time domain filter from time domain into frequency domain through a length-T transformation;
  with respect to each of the frequency bins, estimating source signals by filtering the transformed input signals through the respective unmixing filter configured with the calculated values of the coefficients; and
  transforming the estimated source signals on the respective frequency bins into time domain,
  wherein the cost function is adapted to evaluate decorrelation between the estimated source signals.

* * * * *